United States Patent
Wilcoxon et al.

(10) Patent No.: US 8,166,645 B2
(45) Date of Patent: *May 1, 2012

(54) METHOD FOR PROVIDING NEAR-HERMETICALLY COATED, THERMALLY PROTECTED INTEGRATED CIRCUIT ASSEMBLIES

(75) Inventors: Ross K. Wilcoxon, Cedar Rapids, IA (US); Nathan P. Lower, North Liberty, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1074 days.

This patent is subject to a terminal disclaimer.

(21) Appl. No.: 11/732,981

(22) Filed: Apr. 5, 2007

(65) Prior Publication Data

US 2008/0299300 A1 Dec. 4, 2008

Related U.S. Application Data

(63) Continuation-in-part of application No. 11/508,782, filed on Aug. 23, 2006, now Pat. No. 8,076,185.

(51) Int. Cl.
*H05K 3/30* (2006.01)
(52) U.S. Cl. .............. 29/841; 29/832; 427/96.2
(58) Field of Classification Search ............ 174/262; 427/96.2; 428/432; 524/440, 441; 29/832, 29/841
See application file for complete search history.

(56) References Cited

U.S. PATENT DOCUMENTS

| | | |
|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,513,029 A | 4/1985 | Sakai |
| 4,560,084 A | 12/1985 | Wolfson |
| 4,572,924 A | 2/1986 | Wakely et al. |
| 4,622,433 A | 11/1986 | Frampton |
| 4,761,518 A | 8/1988 | Butt et al. |

(Continued)

FOREIGN PATENT DOCUMENTS

JP 60-013875 1/1985

(Continued)

OTHER PUBLICATIONS

Non-Final Office Action for U.S. Appl. No. 11/784,932, dated Apr. 3, 2009, 8 pages.

(Continued)

*Primary Examiner* — Donghai D. Nguyen
(74) *Attorney, Agent, or Firm* — Donna P. Suchy; Daniel M. Barbieri

(57) ABSTRACT

The present invention is a method for providing an integrated circuit assembly, the integrated circuit assembly including an integrated circuit and a substrate. The method includes mounting the integrated circuit to the substrate. The method further includes adding thermally conductive particles to a low processing temperature, at least near-hermetic, glass-based coating. The method further includes, during assembly of the integrated circuit assembly, applying a low processing temperature, at least near-hermetic, glass-based coating directly to at least one of the integrated circuit and the substrate. The method further includes curing the coating.

12 Claims, 4 Drawing Sheets

U.S. PATENT DOCUMENTS

| | | | |
|---|---|---|---|
| 4,765,948 | A | 8/1988 | Deluca et al. |
| 4,773,826 | A | 9/1988 | Mole |
| 4,802,531 | A | 2/1989 | Nathenson et al. |
| 4,882,212 | A | 11/1989 | SinghDeo et al. |
| 5,041,342 | A | 8/1991 | Umeda et al. |
| 5,136,365 | A | 8/1992 | Pennisi et al. |
| 5,140,109 | A | 8/1992 | Matsumoto et al. |
| 5,184,211 | A | 2/1993 | Fox |
| 5,195,231 | A | 3/1993 | Fanning et al. |
| 5,232,970 | A | 8/1993 | Solc et al. |
| 5,244,726 | A | 9/1993 | Laney et al. |
| 5,265,136 | A | 11/1993 | Yamazaki et al. |
| 5,315,155 | A | 5/1994 | O'Donnelly et al. |
| 5,502,889 | A | 4/1996 | Casson et al. |
| 5,581,286 | A | 12/1996 | Hayes et al. |
| 5,686,703 | A | 11/1997 | Yamaguchi |
| 5,702,963 | A | 12/1997 | Vu et al. |
| 5,863,605 | A | 1/1999 | Bak-Boychuk et al. |
| 5,916,944 | A * | 6/1999 | Camilletti et al. ............ 524/441 |
| 5,958,794 | A | 9/1999 | Bruxvoort et al. |
| 5,965,947 | A | 10/1999 | Nam et al. |
| 5,991,351 | A | 11/1999 | Woolley |
| 6,010,956 | A | 1/2000 | Takiguchi et al. |
| 6,019,165 | A | 2/2000 | Batchelder |
| 6,021,844 | A | 2/2000 | Batchelder |
| 6,027,791 | A | 2/2000 | Higashi et al. |
| 6,028,619 | A * | 2/2000 | Saita et al. .................... 347/209 |
| 6,039,896 | A | 3/2000 | Miyamoto et al. |
| 6,048,656 | A | 4/2000 | Akram et al. |
| 6,087,018 | A | 7/2000 | Uchiyama |
| 6,110,656 | A | 8/2000 | Eichorst et al. |
| 6,121,175 | A | 9/2000 | Drescher et al. |
| 6,124,224 | A | 9/2000 | Sridharan et al. |
| 6,159,910 | A | 12/2000 | Shimizu et al. |
| 6,356,334 | B1 | 3/2002 | Mathew et al. |
| 6,423,415 | B1 | 7/2002 | Greene et al. |
| 6,451,283 | B1 | 9/2002 | Kuznicki et al. |
| 6,452,090 | B2 | 9/2002 | Takato et al. |
| 6,486,087 | B1 | 11/2002 | Saling et al. |
| 6,586,087 | B2 | 7/2003 | Young |
| 6,599,643 | B2 | 7/2003 | Heimann et al. |
| 6,658,861 | B1 | 12/2003 | Ghoshal et al. |
| 6,665,186 | B1 | 12/2003 | Calmidi et al. |
| 6,708,501 | B1 | 3/2004 | Ghoshal et al. |
| 6,798,072 | B2 | 9/2004 | Kajiwara et al. |
| 6,800,326 | B1 | 10/2004 | Uchiyama |
| 6,918,984 | B2 | 7/2005 | Murray et al. |
| 7,045,905 | B2 | 5/2006 | Nakashima |
| 7,078,263 | B2 | 7/2006 | Dean |
| 7,131,286 | B2 | 11/2006 | Ghoshal et al. |
| 7,176,564 | B2 | 2/2007 | Kim |
| 7,202,598 | B2 | 4/2007 | Juestel et al. |
| 7,293,416 | B2 | 11/2007 | Ghoshal |
| 7,296,417 | B2 | 11/2007 | Ghoshal |
| 7,297,206 | B2 | 11/2007 | Naruse et al. |
| 7,340,904 | B2 | 3/2008 | Sauciuc et al. |
| 7,342,787 | B1 | 3/2008 | Bhatia |
| 7,348,665 | B2 | 3/2008 | Sauciuc et al. |
| 7,391,060 | B2 | 6/2008 | Oshio |
| 7,491,431 | B2 | 2/2009 | Chiruvolu et al. |
| 7,692,259 | B2 | 4/2010 | Suehiro |
| 7,737,356 | B2 | 6/2010 | Goldstein |
| 2001/0015443 | A1 | 8/2001 | Komoto |
| 2001/0046933 | A1 | 11/2001 | Parkhill et al. |
| 2002/0000630 | A1 | 1/2002 | Coyle |
| 2002/0054976 | A1 | 5/2002 | Nakamura et al. |
| 2002/0078856 | A1 | 6/2002 | Hahn et al. |
| 2002/0086115 | A1 | 7/2002 | Lamers et al. |
| 2002/0170173 | A1 | 11/2002 | Mashino |
| 2002/0189495 | A1 | 12/2002 | Hayashi et al. |
| 2002/0189894 | A1 | 12/2002 | Davis et al. |
| 2003/0047735 | A1 | 3/2003 | Kyoda et al. |
| 2003/0080341 | A1 | 5/2003 | Sakano et al. |
| 2003/0218258 | A1 | 11/2003 | Charles et al. |
| 2003/0228424 | A1 | 12/2003 | Dove et al. |
| 2004/0106037 | A1 | 6/2004 | Cho et al. |
| 2004/0116577 | A1 | 6/2004 | Naruse et al. |
| 2004/0156995 | A1 | 8/2004 | Komiyama et al. |
| 2004/0194667 | A1 | 10/2004 | Reuscher |
| 2005/0003947 | A1 | 1/2005 | Mazany et al. |
| 2005/0082691 | A1 | 4/2005 | Ito et al. |
| 2005/0099775 | A1 | 5/2005 | Pokharna et al. |
| 2005/0123684 | A1 | 6/2005 | Makowski et al. |
| 2005/0179742 | A1 | 8/2005 | Keenan et al. |
| 2006/0045755 | A1 | 3/2006 | McDonald et al. |
| 2006/0068218 | A1 | 3/2006 | Hooghan et al. |
| 2006/0095677 | A1 | 5/2006 | Hakura et al. |
| 2006/0113066 | A1 | 6/2006 | Mongia et al. |
| 2006/0135342 | A1 | 6/2006 | Anderson et al. |
| 2006/0158849 | A1 | 7/2006 | Martin et al. |
| 2006/0250731 | A1 | 11/2006 | Parkhurst et al. |
| 2006/0268525 | A1 | 11/2006 | Jeong |
| 2006/0283546 | A1 | 12/2006 | Tremel et al. |
| 2007/0075323 | A1 | 4/2007 | Kanazawa et al. |
| 2007/0102833 | A1 | 5/2007 | Hack et al. |
| 2007/0108586 | A1 | 5/2007 | Uematsu et al. |
| 2007/0224400 | A1 | 9/2007 | Meguro et al. |
| 2008/0006204 | A1 | 1/2008 | Rusinko et al. |
| 2008/0050512 | A1 | 2/2008 | Lower et al. |
| 2008/0063875 | A1 | 3/2008 | Robinson et al. |
| 2008/0142966 | A1 | 6/2008 | Hirano et al. |

FOREIGN PATENT DOCUMENTS

| | | |
|---|---|---|
| JP | 02-064071 | 3/1990 |
| JP | 2003-332505 A | 11/2003 |
| WO | WO-2006/095677 | 9/2006 |
| WO | WO 2006/095677 A1 | 9/2006 |
| WO | PCT/US2008/074224 | 8/2008 |
| WO | PCT/US2008/075591 | 9/2008 |
| WO | PCT/US2009/031699 | 1/2009 |

OTHER PUBLICATIONS

Non-Final Office Action for U.S. Appl. No. 11/784,158, dated Apr. 21, 2009, 10 pages.

Final Office Action for U.S. Appl. No. 11/508,782, dated Jun. 16, 2009, 13 pages.

International Search Report and Written Opinion for Application No. PCT/US2009/036355, mail date Jun. 30, 2009, 11 pages.

International Search Report and Written Opinion for Application No. PCT/US2009/031699, mail date Aug. 18, 2009, 16 pages.

Office Action for U.S. Appl. No. 11/959,225, mail date Dec. 2, 2009, 15 pages.

Office Action for U.S. Appl. No. 11/784,158, mail date Oct. 8, 2009, 7 pages.

Office Action for U.S. Appl. No. 12/116,126, mail date Nov. 20, 2009, 7 pages.

Office Action for U.S. Appl. No. 11/784,932, mail date Feb. 16, 2010, 11 pages.

Office Action for U.S. Appl. No. 11/508,782, mail date Feb. 24, 2010, 12 pages.

Office Action for U.S. Appl. No. 11/784,158, mail date Mar. 26, 2010, 7 pages.

Office Action for U.S. Appl. No. 12/116,126, mail date Apr. 22, 2010, 7 pages.

Office Action for U.S. Appl. No. 11/959,225, mail date May 26, 2010, 17 pages.

Office Action for U.S. Appl. No. 11/784,158, mail date Jun. 17, 2010, 7 pages.

Advisory Action and Examiner Interview Summary for U.S. Appl. No. 11/508,782, mail date Nov. 23, 2010, 5 pages.

Examiner Interview Summary for U.S. Appl. No. 11/508,782, mail date Jan. 5, 2011, 2 pages.

Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.

International Search Report and Written Opinion for International Application No. PCT/US2008/074224, mail date Jan. 30, 2009, 10 pages.

International Search Report and Written Opinion for International Application No. PCT/US2008/075591, mail date Apr. 8, 2009, 7 pages.

Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.

Mysen, B. et al. Silicate Glasses and Melts, vol. 10: Properties and Structure (Developments in Geochemistry) (Book Description), printed on Dec. 3, 2010 from website: http://www.amazon.com/Silicate-Glasses-Melts-Developments-Geochemistry/dp/0444520112, 4 pgs.

Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.

Notice of Allowance for U.S. Appl. No. 11/784,158, mail date Nov. 29, 2010, 8 pages.

Office Action for U.S. Appl. No. 11/508,782, mail date Sep. 2, 2010, 14 pages.

Office Action for U.S. Appl. No. 12/284,670, mail date Sep. 28, 2010, 11 pages.

Office Action for U.S. Appl. No. 12/116,126, mail date Oct. 25, 2010, 9 pages.

Office Action for U.S. Appl. No. 11/959,225, mail date Oct. 27, 2010, 12 pages.

Office Action for U.S. Appl. No. 11/784,932, mail date Nov. 10, 2010, 10 pages.

Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.

Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.

The Mixed—Alkali Effect for the Viscosity of Glasses, printed on Dec. 3, 2010 from website: http://glassproperties.com/viscosity/mixed-alkali-effect-viscosity/, 7 pages.

The Structure of Glasses. Alkali silicate glasses, printed on Dec. 3, 2010 from website: http://www.ptc.tugraz.at/specmag/struct/ss.htm, 1 page.

U.S. Appl. No. 12/286,207, filed Sep. 29, 2008, Lower et al.
U.S. Appl. No. 12/240,775, filed Sep. 29, 2008, Lower et al.
U.S. Appl. No. 12/116,126, filed May 6, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/784,158, filed Apr. 5, 2007, Lower et al.
U.S. Appl. No. 11/732,982, filed Apr. 5, 2007, Boone et al.
U.S. Appl. No. 11/508,782, filed Aug. 23, 2006, Lower et al.

Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.

Lewis, J. A., et al., Materialstoday: Jul./Aug. 2004, Direct Writing in three dimension, ISSN: 1369 7021 © Elsevier Ltd 2004, pp. 32-39.

Optomec® Systems M3D® Breakthrough Technology for Printable Electronics, pp. 1-2.

PQ Corporation, "Bonding and Coating Applications of PQ® Soluble Silicates," Bulletin 12-31, (2003) p. 7.

PQ Corporation, PQ® Soluble Silicates in Refractory and Chemical-Resistant Cements, Bulletin 24-1, (2003), p. 6.

Thresh, John C., "The Action of Natural Waters on Lead," The Analyst, vol. XLVII, No. 560, (Nov. 1922) pp. 459-468.

Office Action for U.S. Appl. No. 12/286,207, mail date Dec. 27, 2010, 15 pages.

Office Action for U.S. Appl. No. 11/508,782, mail date Jan. 19, 2011, 10 pages.

Office Action for U.S. Appl. No. 11/732,982, mail date Feb. 2, 2011, 16 pages.

Office Action for U.S. Appl. No. 12/284,670, mail date Feb. 17, 2011, 13 pages.

Office Action for U.S. Appl. No. 12/116,126, mail date Feb. 25, 2011, 9 pages.

Office Action for U.S. Appl. No. 11/959,225, mail date Apr. 13, 2011, 17 pages.

Notice of Allowance for U.S. Appl. No. 12/284,670, mail date May 11, 2011, 7 pages.

Notice of Allowance for U.S. Appl. No. 11/784,932, mail date May 12, 2011, 11 pages.

Notice of Allowance for U.S. Appl. No. 11/508,782, mail date May 31, 2011, 9 pages.

Notice of Allowance for U.S. Appl. No. 12/286,207, mail date Jun. 27, 2011, 12 pages.

Office Action for U.S. Appl. No. 12/116,126, mail date May 10, 2011, 8 pages.

Office Action for U.S. Appl. No. 12/240,775, mail date May 26, 2011, 10 pages.

Office Action for U.S. Appl. No. 11/732,982, mail date Jun. 21, 2011, 15 pages.

Office Action for U.S. Appl. No. 11/959,225, mail date Jul. 22, 2009, 10 pages.

Response for U.S. Appl. No. 11/959,225, mail date Mar. 2, 2010, 9 pages.

Amendment and Reply for U.S. Appl. No. 11/959,225, mail date Jan. 27, 2011, 9 pages.

Amendment and Reply for U.S. Appl. No. 11/959,225, mail date Jun. 13, 2011, 12 pages.

Advisory Action for U.S. Appl. No. 11/959,225, mail date Jul. 5, 2011, 3 pages.

Amendment and Reply for U.S. Appl. No. 11/508,782, mail date Sep. 2, 2008, 7 pages.

Office Action for U.S. Appl. No. 11/508,782, mail date Dec. 24, 2008, 9 pages.

Amendment and Reply for U.S. Appl. No. 11/508,782, mail date Mar. 24, 2009, 10 pages.

Amendment and Reply for U.S. Appl. No. 11/508,782, mail date Aug. 14, 2009, 12 pages.

Advisory Action for U.S. Appl. No. 11/508,782, mail date Aug. 31, 2009, 3 pages.

Response for U.S. Appl. No. 11/508,782, mail date Nov. 13, 2009, 14 pages.

Amendment and Reply for U.S. Appl. No. 11/508,782, mail date Jun. 24, 2010, 10 pages.

Amendment and Reply for U.S. Appl. No. 11/508,782, mail date Nov. 2, 2010, 12 pages.

Supplemental Amendment and Reply for U.S. Appl. No. 11/508,782, mail date Nov. 3, 2010, 3 pages.

Request for Continued Examination for U.S. Appl. No. 11,508,782, mail date Dec. 2, 2010, 10 pages.

Amendment and Reply for U.S. Appl. No. 11/508,782, mail date Apr. 5, 2011, 9 pages.

Request for Continued Examination for U.S. Appl. No. 11/508,782, mail date Aug. 30, 2011, 6 pages.

Notice of Allowance for U.S. Appl. No. 11/508,782, mail date Jul. 26, 2011, 4 pages.

Notice of Allowance for U.S. Appl. No. 11/508,782, mail date Sep. 20, 2011, 7 pages.

Response for U.S. Appl. No. 11/784,158, mail date Jan. 8, 2010, 10 pages.

Amendment and Reply for U.S. Appl. No. 11/784,158, mail date May 26, 2010, 12 pages.

Terminal Disclaimer for U.S. Appl. No. 11/784,158, mail date May 26, 2010, 1 page.

Terminal Disclaimer Decision for U.S. Appl. No. 11/784,158, mail date Jun. 8, 2010, 1 page.

Response for U.S. Appl. No. 12/116,126, mail date Feb. 22, 2010, 10 pages.

Amendment and Reply for U.S. Appl. No. 12/116,126, mail date Aug. 10, 2011, 11 pages.

Office Action for U.S. Appl. No. 12/116,126, mail date Sep. 12, 2011, 11 pages.

Response for U.S. Appl. No. 11/784,932, mail date Jul. 2, 2009, 8 pages.

Request for Continued Examination for U.S. Appl. No. 11/784,932, Aug. 10, 2011, 6 pages.

Notice of Allowance for U.S. Appl. No. 11/784,932, mail date Aug. 23, 2011, 8 pages.
Request for Continued Examination for U.S. Appl. No. 11/732,982, mail date Aug. 22, 2011, 11 pages.
Office Action for U.S. Appl. No. 11/732,982, mail date Sep. 14, 2011, 13 pages.
Notice of Allowance for U.S. Appl. No. 12/286,207, mail date Oct. 6, 2011, 8 pages.

Terminal Disclaimer for U.S. Appl. No. 11/732,981, mail date May 16, 2011, 1 page.
Terminal Disclaimer Decision for U.S. Appl. No. 11/732,981, mail date Jul. 11, 2011, 1 page.

* cited by examiner

METHOD FOR PROVIDING NEAR-HERMETICALLY COATED, THERMALLY PROTECTED INTEGRATED CIRCUIT ASSEMBLIES

CROSS-REFERENCE TO RELATED APPLICATIONS

The present application is a continuation-in-part application and claims priority under 35 U.S.C. §120 to the U.S. patent application Ser. No. 11/508,782 entitled: Integrated Circuit Protection and Ruggedization Coatings and Methods filed Aug. 23, 2006, now U.S. Pat. No. 8,076,185 which is herein incorporated by reference in its entirety.

FIELD OF THE INVENTION

The present invention relates to the field of packaging and interconnection of integrated circuit assemblies and particularly to a method for providing near-hermetically coated, thermally protected integrated circuit assemblies.

BACKGROUND OF THE INVENTION

Integrated circuit packages are produced for usage in a variety of products or for a variety of applications. For example, integrated circuit packages which are designed for use in military and avionics applications are often required to operate and survive under aggressive or rigorous operating conditions and environments. Because such integrated circuit packages (ex—hermetic packages) may typically be very costly to produce, they are often expected to have a long lifespan (i.e., remain functionally operable over a long period of time), such as for 20 years or more.

Contrastingly, most currently available integrated circuit packages are designed for usage in products which present relatively benign/much less rigorous operating conditions, such as desktop PC's, electronic games and cell phones. Such integrated circuit packages are commonly referred to as Commercial off the Shelf (COTS) devices. Because COTS devices may typically be relatively inexpensive to produce, they may tend to have a relatively short lifespan (ex—2 to 5 years).

In recent years the military electronics industry has sought a less expensive alternative to the high cost integrated circuit packages discussed above, which are currently implemented in highly rigorous military and avionics applications. One alternative has been to implement the currently available (and less expensive) COTS devices, in the more demanding military and avionics environments. However, when the currently available COTS devices have been subjected to these more rigorous conditions, they have been especially prone to failure due to higher operating temperatures, corrosion, or the like. Current methods of modifying or designing integrated circuit packages for improved thermal performance are typically very expensive and may be detrimental to reliability.

Another significant trend that has recently developed in the microelectronics industry is the concentration of higher power onto/into fewer functional areas. On the macro scale, this has led to integrated circuits that dissipate significantly more power than their predecessors, thereby requiring more efficient thermal management. A more significant issue is on the micro scale in which a power on an individual integrated circuit is not dissipated uniformly, but is instead concentrated at hot spots on the die. While the majority of the integrated circuit may be operating at a safe temperature, small hot spot regions may be significantly hotter and may greatly reduce the reliability of the entire circuit. The need to spread this power has, for example, led to increased use of multicore processors in an attempt to distribute the die level power dissipation over larger areas. Existing methods for hot spot thermal spreading, such as Chemical Vapor Deposition (CVD) diamond films, are very expensive to apply and may significantly disrupt other assembly processes.

Thus, it would be desirable to have a method for providing near-hermetically coated, thermally protected integrated circuit assemblies which address the problems associated with current solutions.

SUMMARY OF THE INVENTION

Accordingly, an embodiment of the present invention is directed to a method for providing an integrated circuit assembly, the integrated circuit assembly including an integrated circuit and a substrate, the method including: mounting the integrated circuit to the substrate; adding thermally conductive particles to a low processing temperature, at least near-hermetic, glass-based coating; during assembly of the integrated circuit assembly, applying the low processing temperature, at least near-hermetic, glass-based coating directly to at least one of the integrated circuit and the substrate; and curing the coating.

A further embodiment of the present invention is directed to a method for providing an electronic device, the electronic device including an integrated circuit assembly, the integrated circuit assembly including an integrated circuit and a substrate, the method including: mounting the integrated circuit to the substrate; adding thermally conductive particles to a low processing temperature, at least near-hermetic, glass-based coating; during assembly of the integrated circuit assembly, applying the low processing temperature, at least near-hermetic, glass-based coating directly to at least one of the integrated circuit and the substrate; curing the coating; and at least substantially enclosing the integrated circuit assembly within a housing.

A still further embodiment of the present invention is directed to an integrated circuit assembly, including: a substrate; and an integrated circuit configured for being mounted to the substrate, wherein at least one of the integrated circuit and the substrate are at least partially coated with a low processing temperature, at least near-hermetic, glass-based coating, the coating including thermally conductive particles for promoting reduction of thermal resistance of the integrated circuit assembly.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1A:
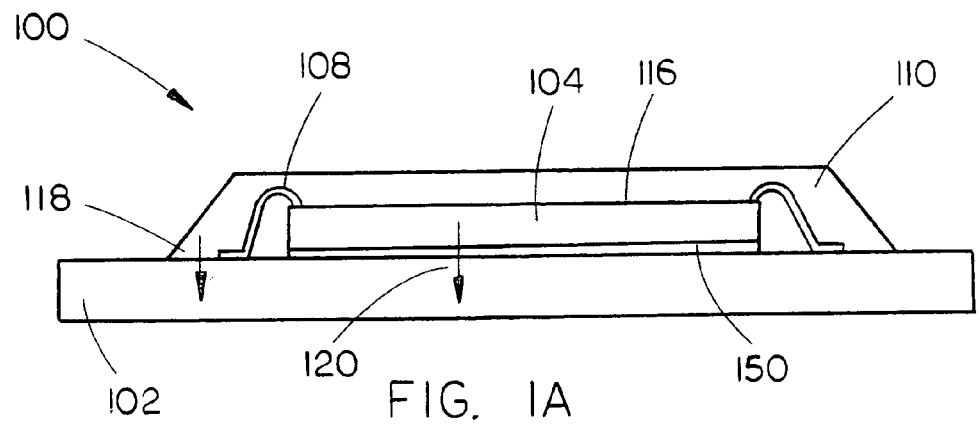
FIG. 1A is a view of a wire-bonded integrated circuit assembly in which both an integrated circuit of the integrated circuit assembly and a substrate of the integrated circuit assembly are at least partially coated in accordance with an exemplary embodiment of the present invention.
Figure 1B:
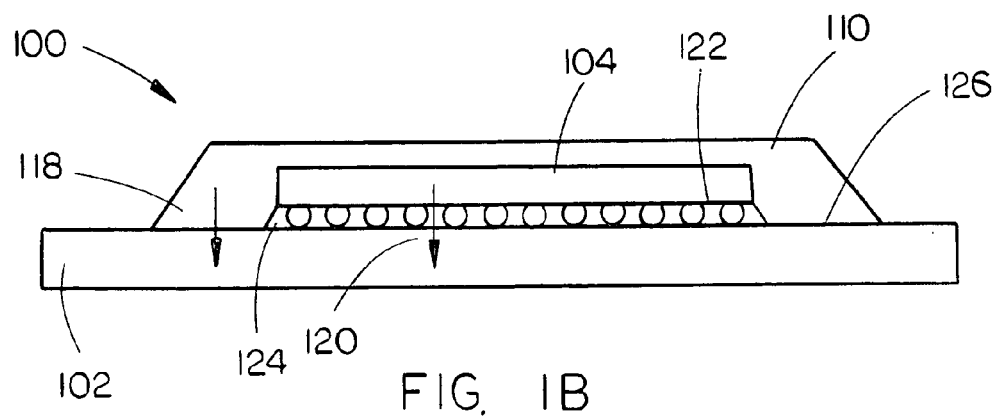
FIG. 1B is a view of a flip-chip bonded integrated circuit assembly in which both an integrated circuit of the integrated circuit assembly and a substrate of the integrated circuit assembly are at least partially coated and the coating is also applied as an underfill between the integrated circuit of the integrated circuit assembly and the substrate of the integrated circuit assembly in accordance with an exemplary embodiment of the present invention.

FIGS. 1A and 1B each illustrate an isometric view of an integrated circuit assembly in accordance with exemplary embodiments of the present invention. In a present embodiment, the integrated circuit assembly 100 includes a substrate 102. In exemplary embodiments, the substrate 102 may be (or may be part of) a chip carrier, such as a Ball Grid Array, a Chip Scale Package substrate, a package substrate, a device substrate, a Ceramic Pin Grid Array (CPGA), a Dual in-line package, an Organic Pin Grid Array (OPGA), a Pin Grid Array, a Multi-chip Module (MCM), or the like, and may be configured for at least partially encapsulating and protecting an integrated circuit 104. Further, the substrate 102 may be formed of a ceramic material, a plastic material, an epoxy material, a laminate material, a metal material or the like for promoting the prevention of physical damage and/or corrosion of the integrated circuit 104. In further embodiments, the substrate 102 may be a printed circuit board. For instance, the printed circuit board may be a motherboard, an expansion board, a card, a daughtercard, a controller board, a network interface card (NIC), a video adapter, an organic circuit board, an inorganic circuit board, a heat sink or the like.

In current embodiments, the integrated circuit assembly 100 includes the integrated circuit 104. For instance, the integrated circuit 104 (IC) may be a microcircuit, a chip, a microchip, a silicon chip, a computer chip, a monolithic integrated circuit, a hybrid integrated circuit, a die, or the like.

The integrated circuit 104 of the present invention is configured for being mounted to the substrate 102. In an exemplary embodiment, as shown in FIG. 1B, the integrated circuit 104 may be flip-chip bonded to the substrate 102. In an alternative embodiment, as shown in FIG. 1A, the integrated circuit 104 may be wire bonded (such as by ball bonding, wedge bonding, or the like) to the substrate 102 via one or more bond wires 108. Further, in wire-bonded embodiments, one or more of heat, pressure and ultrasonic energy may be utilized in attaching the ends of the wire 108 to the substrate 102 and integrated circuit 104 respectively for electrically connecting the integrated circuit 104 to the substrate 102.

In a present embodiment, at least one of the integrated circuit 104 and the substrate 102 of the integrated circuit assembly 100 may be at least partially coated with a coating 110. In a current embodiment, the coating 110 may be a hermetic (ex—airtight) or near-hermetic coating for promoting reliability of the integrated circuit assembly 100 in high temperature operating environments and/or corrosive operating environments, such as military or avionics environments. In further embodiments, the coating 110 may be a low processing temperature coating. For instance, the coating 110 may be formulated for being applied and/or cured at a temperature of less than or equal to 160 degrees Celsius. In further embodiments, higher temperatures may be used to shorten cure times. In additional embodiments, the coating 110 may be a glass-based coating. For example, the coating 110 may be an alkali silicate-based coating.

In exemplary embodiments, the coating 110 may include thermally conductive particles for promoting improved thermal conductivity of the coating, thereby promoting reduction of thermal resistance, such as a junction-to-case thermal resistance or an overall junction to ambient thermal resistance, of the integrated circuit assembly 100. For instance, the coating 110 may include one or more of the following: diamond particles, Gallium Nitride particles, Silicon Carbide particles; aluminum nitride particles, beryllium oxide particles, metals (ex—copper), metal particles, CNTs (Carbon Nanotubes), graphite, or the like, for promoting improved thermal conductivity of the coating and for modifying a thermal expansion coefficient of the coating to achieve a better match to a coated surface (ex—surface of an integrated circuit, substrate, etc.). The particles may be in the form of spheres, flakes, whiskers or the like. Further, the particles may be varying sizes, such as nanoparticles, microparticles, or the like. In further embodiments, the thermally conductive particles may have a thermal conductivity of at least two hundred watts per meters-Kelvin (200 W/m·K). Still further, the coating may be a variety of formulations, such as any one or more of the formulations described in U.S. patent application Ser. No. 11/508,782 entitled: Integrated Circuit Protection and Ruggedization Coatings and Methods filed Aug. 23, 2006, (pending) which is herein incorporated by reference in its entirety.

In exemplary embodiments, as shown in FIGS. 1A and 1B, the coating 110 may be applied at least substantially over the integrated circuit (ex—a die) 104, which may be mechanically attached to the substrate (ex—a printed circuit board) 102 in such a manner that at least a first portion 112 of the coating 110 is in direct physical contact with the integrated circuit 104, while at least a second portion 114 of the coating 110 is in direct physical contact with the substrate. In the exemplary embodiments, (as shown in FIGS. 1A and 1B) the thermally conductive coating provides/acts as a direct thermal path between a top surface 116 of the integrated circuit 104 and the substrate 102, without creating an electrically conductive path. Further, the direct thermal path 118 provided by the coating 110 may operate in parallel with a traditional thermal path 120 between the integrated circuit 104 and the substrate 102, the traditional thermal path 120 allowing heat to travel through the integrated circuit 104, through an attachment point or interface (which may be/include a die attach 150) between the integrated circuit and substrate 102, and into the substrate 102. Additionally, the coating 110 increases an effective surface area via which heat may be conducted or dissipated to be generally equivalent to a coverage surface area of the coating plus a surface area of the integrated circuit 104, thereby promoting improved thermal management for the integrated circuit assembly 100. By applying the coating 110 as described above, the coating 110 may serve as a low cost thermal path between heat dissipating electronic components, such as the integrated circuit 104 and the substrate 102, and may improve heat transfer from the components by further allowing heat to be spread or distributed across an entire surface area of the integrated circuit 104 and perhaps to the substrate 102 (ex—a printed circuit board).

Figure 4:
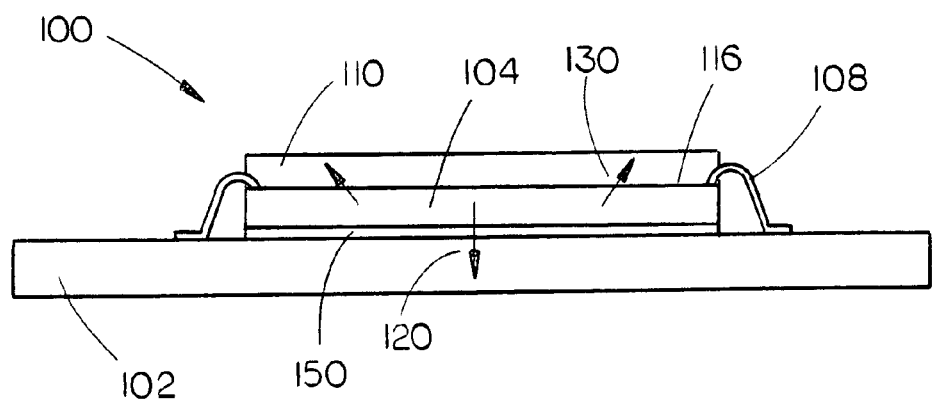
FIG. 4 is a view of a wire-bonded integrated circuit assembly in which an integrated circuit of the integrated circuit assembly is at least partially coated in accordance with an exemplary embodiment of the present invention.

In alternative exemplary embodiments, as shown in FIG. 4, the coating 110 may be applied at least substantially over the top surface 116 of the integrated circuit (ex—a die) 104, which may be mechanically attached and electrically connected (ex—via wire-bonding or flip-chip bonding) to the substrate (ex—a printed circuit board) 102 in such a manner that the coating 110 is in direct physical contact with only the integrated circuit 104 and not the substrate 102. In the illustrated exemplary embodiment, (shown in FIG. 4) the coating 110 may function to spread heat, which is dissipated 130 at localized "hot spots" of the integrated circuit 104, (ex—junctions, gates, etc.), over the entire surface of the integrated circuit 104. Such functionality of the coating 110 may thereby promote temperature leveling within the integrated circuit 104, improved thermal management for the integrated circuit assembly 100 and improved reliability of the integrated circuit 104 and integrated circuit assembly 100 (since reliability of an integrated circuit is often determined by peak IC or die temperatures rather than average IC or die temperatures).

In embodiments in which the integrated circuit 104 is flip-chip bonded to the substrate 102, the coating 110 may be applied as an underfill 124 between a bottom surface 122 of the integrated circuit 104 and a top surface 126 of the substrate 102, as shown in FIG. 1B. For example, the coating 110 may be in direct physical contact with the bottom surface 122 of the integrated circuit 104 and the top surface 126 of the substrate 102. In embodiments in which the coating 110 is used as an underfill, Coefficient of Thermal Expansion (CTE) matching filler, such as glass or ceramics, may be added to the coating 110 for improving bond layer reliability. Further, the coating 110 of the present invention may provide an underfill which promotes improved tamper-resistance protection, improved thermal cycle, and improved shock loading reliability of the integrated circuit 104. Still further, the coating 110 of the present invention may provide an underfill which may withstand high electronic device and/or integrated circuit assembly temperatures. In additional embodiments, the coating 110 may be applied to various portions of the integrated circuit 104 and/or the substrate 102 and/or various interfaces between the integrated circuit 104 and the substrate 102. In still further embodiments, the coating 110 may be applied to respective surfaces of and/or interfaces between one or more electronics components for promoting improved thermal management for said components. For example, the coating may be applied to respective surfaces of and/or interfaces between two or more integrated circuits, the two or more integrated circuits being electrically connected with one another. In exemplary embodiments, the coating may also allow for electronic components, integrated circuit assemblies and/or integrated circuit assembly components to be more densely packed together due to the thermal conductivity of the coating, thereby resulting in smaller and/or lower profile electronic devices.

In a present embodiment, one or more of the integrated circuit assembly 100, substrate 102 and integrated circuit 104 may be devices which are available for at least one of sale, lease and license to a general public. For instance, the integrated circuit assembly 100, substrate 102 and/or integrated circuit 104 may be a Commercial off the Shelf (COTS) device.

Figure 2:
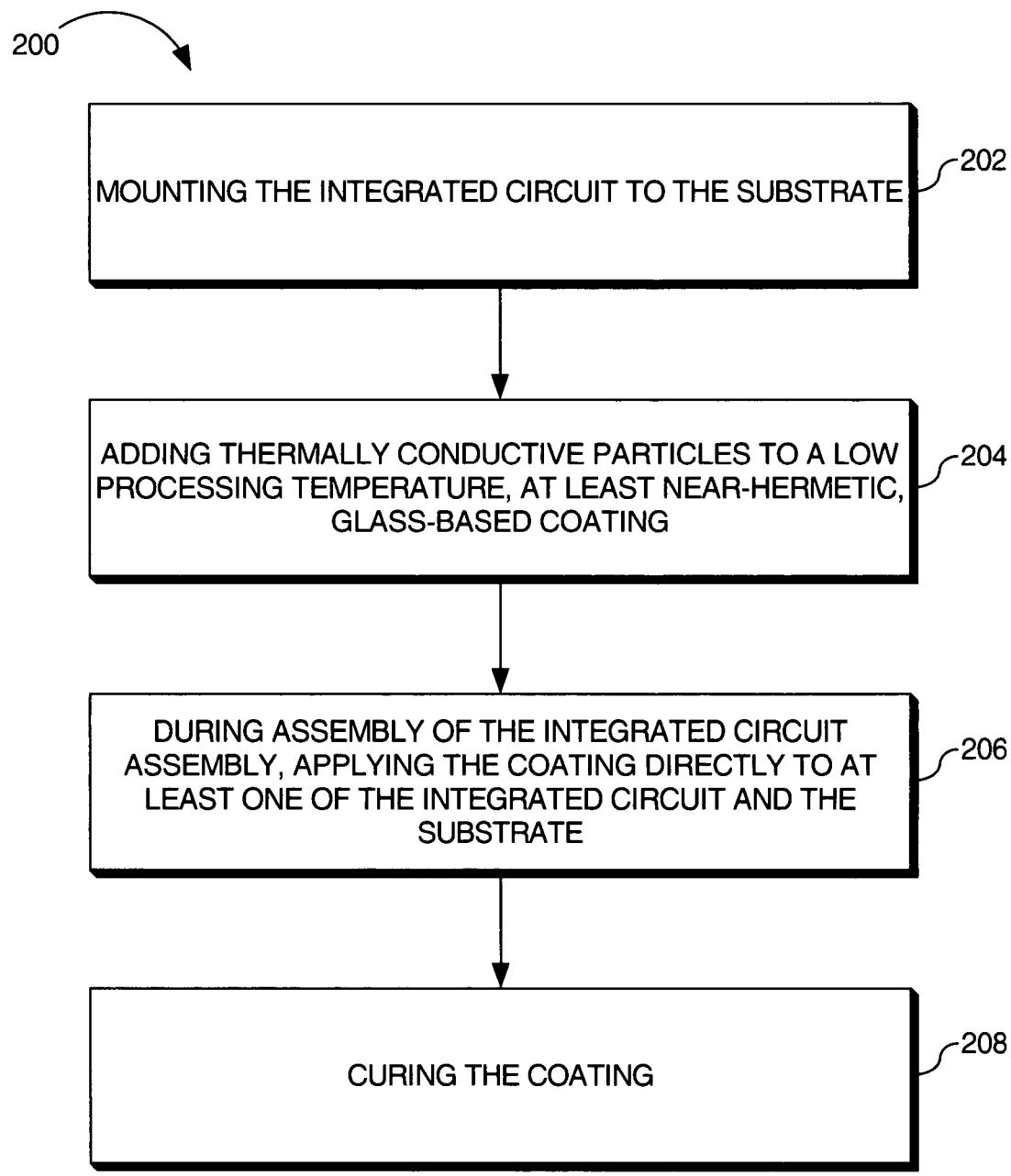
FIG. 2 is a flowchart illustrating a method for providing an integrated circuit assembly in accordance with an exemplary embodiment of the present invention.

FIG. 2 illustrates a method for providing an integrated circuit assembly, the integrated circuit assembly including an integrated circuit and a substrate in accordance with an exemplary embodiment of the present invention. In a present embodiment, the method 200 includes mounting the integrated circuit to the substrate 202. For example, the substrate may be a printed circuit board. Further, the integrated circuit assembly may be wire-bonded to the substrate or flip-chip bonded to the substrate. In additional embodiments, the method 200 further includes adding thermally conductive particles to a low processing temperature, at least near-hermetic, glass-based coating 204. For instance, the thermally conductive particles may have a thermal conductivity of at least two hundred watts per meters-Kelvin (200 W/m·K). Further, the thermally conductive particles may include at least one of: diamond particles; Gallium nitride particles; Silicon Carbide particles; aluminum nitride particles; beryllium oxide particles; metals (ex—copper); metal particles; CNTs (Carbon Nanotubes), graphite, or the like. Additionally, the glass-based coating may be an alkali silicate-based coating.

In further embodiments, the method 200 further includes, during assembly of the integrated circuit assembly, applying the low processing temperature, at least near-hermetic, glass-based coating directly to at least one of the integrated circuit and the substrate 206. For instance, in exemplary embodiments, the coating may be maintained/stored and/or applied at atmospheric pressure. In additional embodiments, the method 200 further includes curing the coating 208. In exemplary embodiments, the steps of applying the coating 206 and curing the coating 208 may be performed at a temperature one hundred sixty (160) degrees Celsius or less. In still further embodiments, applying the coating 204 may include applying the coating in one or more layers in such a manner which may promote prevention of cracking of the coating during curing.

In additional embodiments, prior to applying the coating, nanoparticles/nano-sized particles (ex—particles having at least one dimension less than 100 nm) may be added to the coating for promoting corrosion resistance of the assembly. For example, nano-sized particles of calcium carbonate, zinc oxide, divalent metal cations (ex—transition metal oxides, alkaline earth oxides, etc.), rare earth oxides and/or the like may be added to the coating for promoting corrosion resistance of the integrated circuit assembly.

Figure 3:
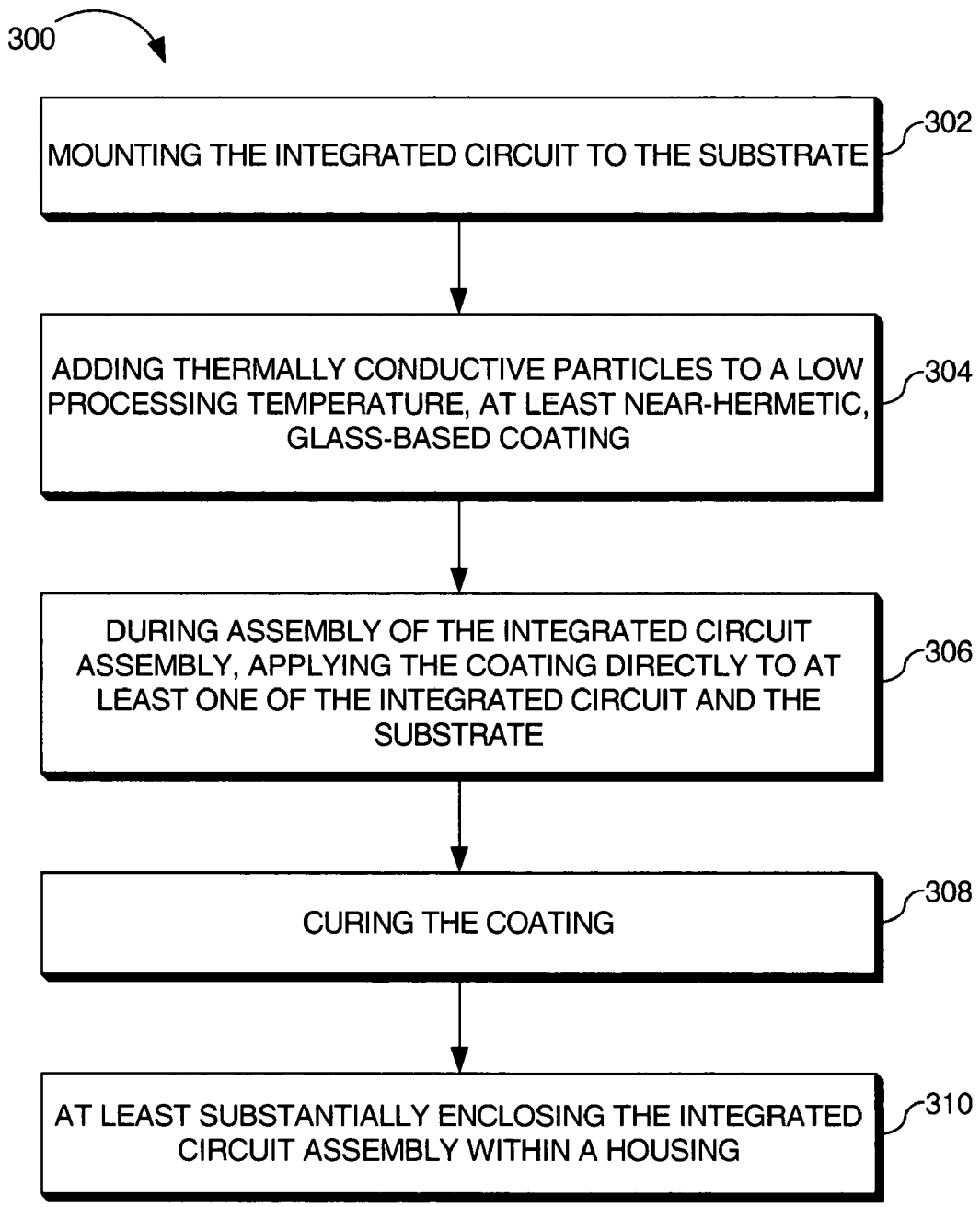
FIG. 3 is a flowchart illustrating a method for providing an electronic device in accordance with an exemplary embodiment of the present invention.

FIG. 3 illustrates a method for providing an electronic device, the electronic device including an integrated circuit assembly, the integrated circuit assembly including an integrated circuit and a substrate in accordance with an exemplary embodiment of the present invention. For instance, the electronic device may be a computer, a cellular phone, or various other devices which may implement the integrated circuit assembly. In a present embodiment, the method 300 includes mounting the integrated circuit to the substrate 302. For example, the substrate may be a printed circuit board. Further, the integrated circuit assembly may be wire-bonded to the substrate or flip-chip bonded to the substrate. In further embodiments, the method 300 includes adding thermally conductive particles to a low processing temperature, at least near-hermetic, glass-based coating 304. For instance, the thermally conductive particles may have a thermal conductivity of at least two hundred watts per meters-Kelvin (200 W/m·K). Further, the thermally conductive particles may include at least one of: diamond particles; Gallium nitride particles; Silicon Carbide particles; aluminum nitride particles; and beryllium oxide particles. Additionally, the glass-based coating may be an alkali silicate-based coating.

In exemplary embodiments, the method 300 further includes, during assembly of the integrated circuit assembly, applying the low processing temperature, at least near-hermetic, glass-based coating directly to at least one of the integrated circuit and the substrate 306. In further embodiments, the method 300 further includes curing the coating 308. In exemplary embodiments, the steps of applying the coating 306 and curing the coating 308 may be performed at a temperature of one hundred sixty (160) degrees Celsius or less. In still further embodiments, applying the coating 306 may include applying the coating in one or more layers to promote prevention of cracking of the coating during curing.

In additional embodiments, prior to applying the coating, nanoparticles/nano-sized particles (ex—particles having at least one dimension less than 100 nm) may be added to the coating for promoting corrosion resistance of the assembly. For example, nano-sized particles of calcium carbonate, zinc oxide, and/or the like may be added to the coating for promoting corrosion resistance of the integrated circuit assembly.

Figure 5:
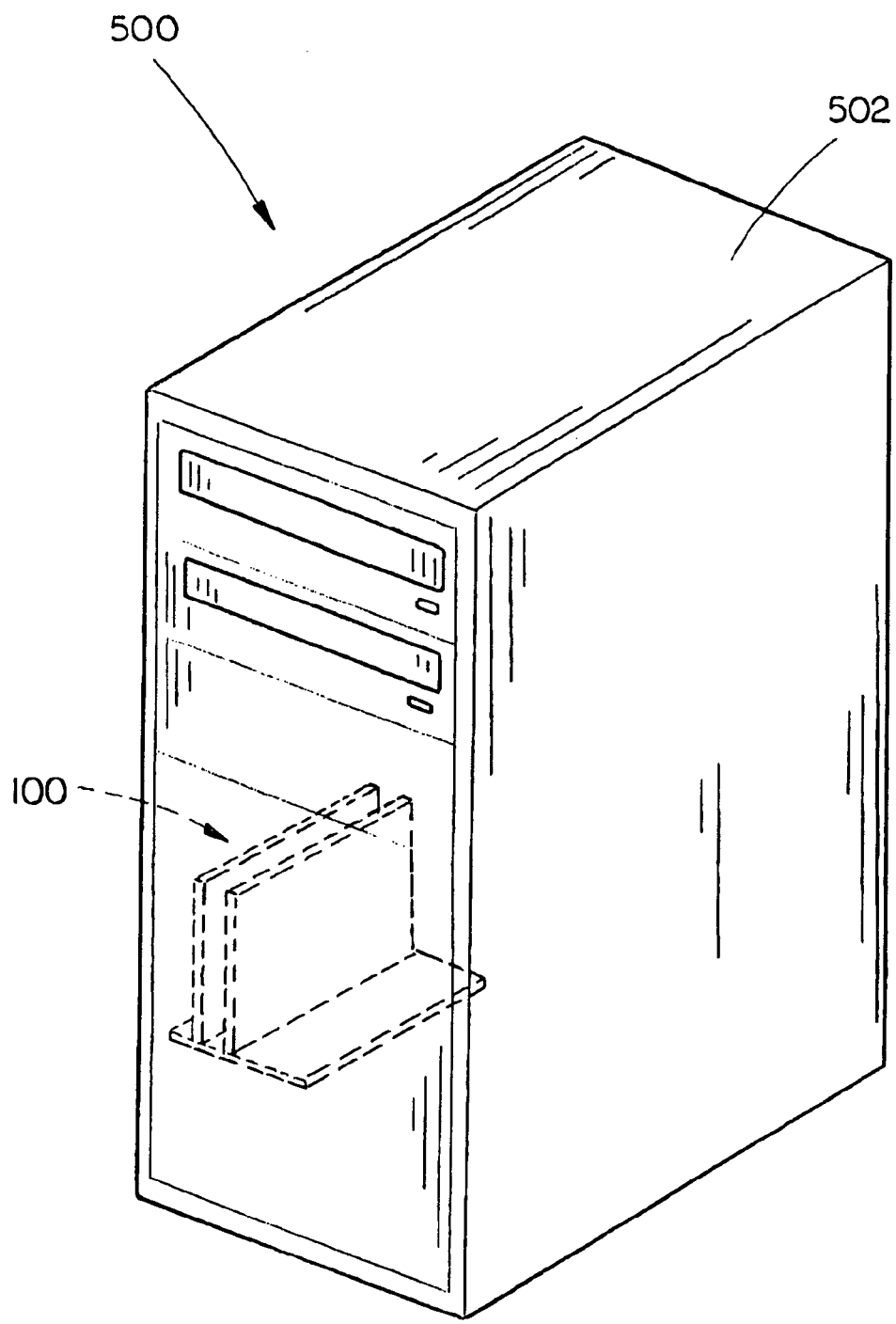
FIG. 5 is an isometric view of an electronic device including an integrated circuit assembly in accordance with an exemplary embodiment of the present invention.

In further embodiments, the method 300 further includes at least substantially enclosing the integrated circuit assembly within a housing 310. For example, as shown in FIG. 5, the electronic device 500 may be a computer and the housing 502 may be a computer tower. In embodiments where the substrate is, for instance, a chip carrier, the step of enclosing the integrated circuit assembly within the housing 310, may include mounting the integrated circuit assembly (ex—integrated circuit and chip carrier) to a printed circuit board, then at least substantially enclosing the integrated circuit assembly and printed circuit board within the housing.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for providing an integrated circuit assembly, the integrated circuit assembly including an integrated circuit and a substrate, the method comprising:

mounting the integrated circuit to the substrate;
adding thermally conductive particles to a low processing temperature, at least near-hermetic, glass-based coating, wherein the glass-based coating is an alkali silicate glass-based coating;
during assembly of the integrated circuit assembly, applying the low processing temperature, at least near-hermetic, glass-based coating directly to the integrated circuit and the substrate; and
curing the coating, wherein the cured coating provides a direct thermal path between the integrated circuit and the substrate without creating an electrically conductive path.

2. A method for providing an integrated circuit assembly as claimed in claim 1, wherein the substrate is at least one of: a chip carrier and a printed circuit board.

3. A method of providing an integrated circuit assembly as claimed in claim 1, wherein the thermally conductive particles have a thermal conductivity of at least two hundred watts per meters-Kelvin (200 W/m·K).

4. A method for providing an integrated circuit assembly as claimed in claim 1, wherein the thermally conductive particles include at least one of: diamond particles; Gallium Nitride particles; Silicon Carbide particles; aluminum nitride particles; beryllium oxide particles; metals; metal particles; Carbon Nanotubes (CNTs), and graphite.

5. A method for providing an integrated circuit assembly as claimed in claim 1, wherein the integrated circuit is connected to the substrate by at least one of wire bonding and flip-chip bonding.

6. A method for providing an integrated circuit assembly as claimed in claim 5, wherein the coating is applied as an underfill between a bottom surface of the integrated circuit and a top surface of the substrate when the integrated circuit is flip-chip bonded to the substrate.

7. A method for providing an electronic device, the electronic device including an integrated circuit assembly, the integrated circuit assembly including an integrated circuit and a substrate, the method comprising:

mounting the integrated circuit to the substrate;
adding thermally conductive particles to a low processing temperature, at least near-hermetic, glass-based coating, wherein the glass-based coating is an alkali silicate glass-based coating;
during assembly of the integrated circuit assembly, applying the low processing temperature, at least near-hermetic, glass-based coating directly to the integrated circuit but not to the substrate; and
curing the coating, wherein the glass-based coating is to spread heat over a surface of the integrated circuit for dissipation.

8. A method for providing an integrated circuit assembly as claimed in claim 7, wherein the substrate is at least one of: a chip carrier and a printed circuit board.

9. A method for providing an integrated circuit assembly as claimed in claim 7, wherein the thermally conductive particles have a thermal conductivity of at least two hundred watts per meters Kelvin (200 W/m·K).

10. A method for providing an integrated circuit assembly as claimed in claim 7, wherein the thermally conductive particles include at least one of: diamond particles; Gallium Nitride particles; Silicon Carbide particles; aluminum nitride particles; and beryllium oxide particles; metals; metal particles; Carbon Nanotubes (CNTs), and graphite.

11. A method for providing an integrated circuit assembly as claimed in claim 7, wherein the integrated circuit is connected to the substrate by at least one of wire bonding and flip-chip bonding.

12. A method for providing an integrated circuit assembly as claimed in claim 11, wherein the coating is applied as an underfill between a bottom surface of the integrated circuit and a top surface of the substrate when the integrated circuit is flip-chip bonded to the substrate.

* * * * *